(12) United States Patent
Beaumont et al.

(10) Patent No.: US 6,802,902 B2
(45) Date of Patent: Oct. 12, 2004

(54) PROCESS FOR PRODUCING AN EPITAXIAL LAYER OF GALLIUM NITRIDE

(75) Inventors: Bernard Beaumont, Valbonne (FR); Pierre Gibart, Chateauneuf de Grasse (FR); Jean-Claude Guillaume, La Gaude (FR); Gilles Nataf, Cagnes sur Mer (FR); Michel Vaille, Antibes (FR); Soufien Haffouz, Nice (FR)

(73) Assignee: Lumilog, Vallauris (FR)

( * ) Notice: Subject to any disclaimer, the term of this patent is extended or adjusted under 35 U.S.C. 154(b) by 347 days.

(21) Appl. No.: 09/960,829

(22) Filed: Sep. 21, 2001

(65) Prior Publication Data

US 2002/0152952 A1 Oct. 24, 2002

Related U.S. Application Data

(63) Continuation of application No. 09/530,050, filed as application No. PCT/FR98/02212 on Oct. 15, 1998, now Pat. No. 6,325,850.

(30) Foreign Application Priority Data

Oct. 20, 1997 (FR) .............................................. 97 13096

(51) Int. Cl.[7] .............................................. C30B 25/14
(52) U.S. Cl. .............................. 117/95; 117/96; 117/97; 117/103; 117/4; 117/8; 117/9; 117/952
(58) Field of Search .............................. 117/95, 96, 97, 117/103, 4, 8, 9, 952

(56) References Cited

U.S. PATENT DOCUMENTS

| | | |
|---|---|---|
| 4,971,928 A | 11/1990 | Fuller |
| 5,874,747 A | 2/1999 | Redwing et al. |
| 5,962,875 A | 10/1999 | Motoki et al. |
| 6,093,965 A | 7/2000 | Nakamura et al. |
| 6,100,104 A | 8/2000 | Haerle |
| 6,325,850 B1 * | 12/2001 | Beaumont et al. ............ 117/95 |
| 2002/0069817 A1 * | 6/2002 | Miahra et al. |

FOREIGN PATENT DOCUMENTS

JP           11329971           * 11/1999

OTHER PUBLICATIONS

Ruterana et al., "Surface treatment and layer structure in 2H–GaN grown on the (0001) surface of 6H–SiC by MBE", MRS internet journal of nitirde semiconductor research vol 2 article 42 1997.*

Kapolnek et al, "Anisotropic epitaxial lateral growth in GaN selective area epitaxy," Applied Physics Letters, vol. 71, No. 9, pp. 1204–1206.

Kapolnek et al, "Selective area epitaxy of GaN for electron field emission devices," Journal of Crystal Growth, vol. 170, No. 1–4, pp. 340–343.

* cited by examiner

Primary Examiner—Robert Kunemund
(74) Attorney, Agent, or Firm—Blakely, Sokoloff, Taylor & Zafman

(57) ABSTRACT

A process for producing an epitaxial layer of gallium nitride (GaN). A film of a dielectric whose thickness is about one monolayer is formed on a surface of a substrate. A continuous gallium nitride layer is then deposited on the dielectric film at a temperature sufficiently low to suppress island formation of the gallium nitride. The deposited gallium nitride layer is annealed at a temperature sufficiently high to promote island formation of the gallium nitride. An epitaxial regrowth with gallium nitride at the end of a spontaneous in situ formation of islands of gallium nitride then takes place. This method makes it possible to avoid having to use ex situ etching of masks by photolitographiy or chemical ethching techniques.

19 Claims, 8 Drawing Sheets

FIG_1

PROCESS FOR PRODUCING AN EPITAXIAL LAYER OF GALLIUM NITRIDE

This is a non-provisional application which is a continuation of Ser. No. 09/530,050 filed Jul. 7, 2000 now U.S. Pat. No. 6,325,850 claiming the benefit of international application number PCT/FR98/02212 filed Oct. 15, 1998.

The present invention relates to a process for producing an epitaxial layer of gallium nitride (GaN) as well as to the epitaxial layers of gallium nitride (GaN) which can be obtained by said process. Such a process makes it possible to obtain gallium nitride layers of excellent quality.

It also relates to the short-wavelength optical devices or the high-power high-frequency electronic devices provided with such an epitaxial gallium nitride layer.

It relates in particular to optoelectronic components formed on such gallium nitride layers.

Processes are known for obtaining relatively thick GaN layers, for example from 100 to 200 micrometers. The method commonly used is chloride and hydride vapor phase epitaxy (HVPE). Either sapphire substrates or GaN layers on sapphire 200 micrometers in thickness are used, these layers being fabricated by OrGaNoMetallic Pyrolisis Vapor Phase Epitaxy (OMVPE). However, the crystal lattice parameter mismatch between sapphire and GaN is such that the build-up of stresses in the layers results in cracks and prevents the sapphire substrate from being removed. All the experimental innovations (treatment of the surface of the sapphire at the start of growth with GaCl, deposition of a ZnO interlayer) have not made it possible to solve this problem. At the present time, the relatively thick GaN layers have a double X-ray diffraction (DXD) line width of the order of at best 300 arcsec, which means that the crystallographic quality does not exceed that of the layers formed by OMVPE or by molecular beam epitaxy (MBE).

In other words, no potential sapphire, ZnO, 6H-SiC or LiAlO$_2$ substrate is ideal for nitride epitaxy (excessively high lattice mismatch and thermal expansion coefficient mismatch, thermal instability).

Moreover, the lasing effect (by optical pumping) on GaN has been known for a long time. Although diode lasers based on III–V nitride have been produced, the crystal quality of the nitride layers constituting the structure of these lasers is very average. Dislocation densities ranging from $10^9$ to $10^{10}$ cm$^{-2}$ have been measured.

In fact, the defects associated with the formation of relatively thick epitaxially grown GaN layers indicated above have considerably slowed down the development of diode lasers provided with such layers: high residual n, absence of single crystals and of suitable substrates, impossibility of producing p-doping.

The publication by D. Kalponek et al., Journal of Crystal Growth, 170 (1997) 340–343 mentions the localized nitride growth in apertures formed in a mask so as to form pyramidal structures. However, this document neither describes nor suggests the formation, by coalescence, of features or islands of smooth gallium nitride layers.

The publication Y. Kato, S. Kitamura, K. Hiramatsu and N. Sawaki, J. Cryst. Growth, 144, 133 (1994) describes the selective growth of gallium nitride by OMVPE on sapphire substrates on which has been deposited a thin gallium nitride layer masked by an SiO$_2$ layer etched so as to reveal continuous bands of gallium nitride.

However, the localized epitaxy thus carried out involves neither the lateral growth nor the growth anisotropy as will be described below.

The document EP 0,506,146 describes a process for local and lateral growth using a mask, shaped by lithography, to localize the growth. The examples of smooth layers relate in no case to gallium nitride. These examples mention GaAs homoepitaxy on a GaAs substrate and InP homoepitaxy on an InP substrate.

The object of the process according to the invention is to obtain crystalline layers allowing the production of optoelectronic devices (especially diode lasers) having life times and performance characteristics which are superior to those obtained previously.

The inventors have found that the treatment of a substrate by deposition of a suitable dielectric followed by deposition of gallium nitride, which is itself followed by thermal annealing, causes the formation of gallium nitride islands which are virtually defect-free.

The coalescence of such islands caused by the heat treatment results in a gallium nitride layer of excellent quality.

The invention relates firstly to a process for producing a layer of gallium nitride (GaN), characterized in that it comprises the deposition on a substrate of a dielectric layer functioning as a mask and the regrowth of gallium nitride on the masked substrate under epitaxial deposition conditions so as to induce the deposition of gallium nitride features and the anisotropic and lateral growth of said features, the lateral growth being continued until coalescence of the various features. The term "islands" instead of "features" may also be employed.

The substrate generally has a thickness of a few hundred micrometers (in particular, approximately 200 micrometers) and may be chosen from the group consisting of sapphire, ZnO, 6H-SiC, LiAlO$_2$, LiGaO$_2$ and MgAl$_2$O$_4$. The substrate is preferably treated beforehand by nitriding.

Preferably, the dielectric is of the Si$_x$N$_y$ type, especially Si$_3$N$_4$. SiO$_2$ may also be mentioned, but other well-known dielectrics could be used. The deposition of the dielectric is carried out in the gallium nitride growth chamber from silane and ammonia.

Preferably, the carrier gas is an N$_2$/H$_2$ mixture.

According to a first embodiment, the dielectric layer is an atomic monolayer, or a cover of the order of the atomic plane.

Next, epitaxial regrowth on the substrate is carried out using OMVPE. Regular features or islands develop. Examination in a high-resolution electron microscope shows that the GaN dislocation density in the regular features or islands, which has therefore grown without heteroepitaxial strains, is very much less than that produced by the direct deposition of gallium nitride on the substrate. Thus, the GaN growth, which takes place laterally in the [10$\bar{1}$0] directions on a dielectric surface, and therefore without being in epitaxial relationship with the sapphire substrate, results in much better GaN crystal quality than the usual processes. After said features have been obtained, the growth may be continued, either using OMVPE or HVPE. Growth takes place laterally, until coalescence of the islands. These surfaces resulting from the coalescence of islands exhibit crystal quality superior to the layers grown heteroepitaxially on sapphire.

The gallium nitride deposition is generally carried out in two steps. A first step, at a temperature of approximately 600° C. for the deposition of a buffer layer, from which the GaN features will emerge, then at a higher temperature (approximately 1000–1100° C.) for the growth of an epilayer from said features.

According to a second embodiment, the invention relates to a process characterized in that the dielectric layer is etched, so as to define apertures and to expose the facing regions of the substrate, and gallium nitride is regrown under epitaxial deposition conditions on the masked and etched substrate so as to induce the deposition of gallium nitride features on the facing regions and the anisotropic and lateral growth of said features, the lateral growth being continued until coalescence of the various features.

According to a third embodiment, the invention relates to a process for producing an epitaxial layer of gallium nitride (GaN), comprising the deposition of a thin gallium nitride layer on a substrate characterized in that:

a dielectric layer is deposited on said thin gallium nitride layer;

the dielectric layer is etched so as to define apertures and to expose those regions of said thin gallium nitride layer which face them;

gallium nitride is regrown under epitaxial deposition conditions on the expitaxially grown, masked and etched substrate so as to induce the deposition of gallium nitride features on the facing regions and the anisotropic and lateral growth of said features, the lateral growth being continued until coalescence of the various features.

The process according to the invention is noteworthy in that it limits the density of defects generated by the parameter mismatch between GaN and the substrate using a method which combines localized epitaxy, growth anisotropy and lateral growth, thereby limiting the epitaxial strains.

The process according to the invention makes use of deposition and etching techniques well-known to those skilled in the art.

According to the second embodiment, a dielectric a few nanometers in thickness is deposited in the growth chamber. Next, by photolithography, apertures are defined in the dielectric layer, thus exposing micrometric regions of the surface of the substrate.

Regrowth on the masked and etched substrate is carried out using OMVPE.

The substrate generally has a thickness of a few hundred micrometers (in particular, approximately 200 micrometers) and may be chosen from the group consisting of sapphire, ZnO, 6H-SiC, $LiAlO_2$, $LiGaO_2$ and $MgAl_2O_4$.

Preferably, the dielectric is of the $Si_xN_y$ type, especially $Si_3N_4$. $SiO_2$ may also be mentioned, but other well-known dielectrics could be used. The dielectric is deposited in the gallium nitride growth chamber from silane and ammonia directly on the substrate, as described above.

According to the third embodiment, the gallium nitride is firstly grown epitaxially on the substrate by OMVPE. The deposition of a dielectric a few nanometers in thickness is then carried out in the growth chamber. Next, by photolithography, apertures are defined in the dielectric layer, thus exposing micrometric regions of the gallium nitride surface.

Regrowth on the epitaxially grown, masked and etched substrate is carried out using OMVPE.

The substrate generally has a thickness of a few hundred micrometers (in particular, approximately 200 micrometers) and may be chosen from the group consisting of sapphire, ZnO, 6H-SiC, $LiAlO_2$, $LiGaO_2$ and $MgAl_2O_4$.

Preferably, the dielectric is of the $Si_xN_y$ type, especially $Si_3N_4$. $SiO_2$ may also be mentioned, but other well-known dielectrics could be used. The dielectric is deposited in the gallium nitride growth chamber from silane and ammonia directly after the gallium nitride deposition.

The etching of the dielectric is in particular carried out by photolithography.

Discrete apertures, or apertures in the form of stripes, are defined in the silicon nitride layer, thus exposing the gallium nitride surface on a micrometric feature. The apertures are preferably regular polygons, especially ones of hexagonal shape. Advantageously, the discrete apertures are inscribed in a circle of radius of less than 10 micrometers, whereas the apertures in the form of stripes have a width of less than 10 micrometers, the length of the stripes being limited only by the size of the substrate.

Spacing of the apertures is regular and must allow, localized gallium nitride epitaxy followed by anisotropic and lateral growth.

In general, the portion of exposed area of substrate or of gallium nitride to the total area of the substrate is between 5 and 80%, preferably between 5 and 50%.

It has been found that gallium atoms are not deposited on the dielectric and that, in other words, this etched dielectric surface allowed the gallium atoms to concentrate on the apertures.

Next, regrowth on the substrate is carried out using OMVPE. Regular features or islands develop. Examination in a high-resolution electron microscope shows that the GaN dislocation density in the regular features or islands, which has therefore grown without heteroepitaxial strains, is very much less, in the case of the third variant, than that existing in the first GaN layer. Thus, the GaN growth, which takes place laterally in the $[10\bar{1}0]$ directions on a dielectric surface, and therefore without being in epitaxial relationship with the sapphire substrate, results in much better GaN crystal quality than the usual processes. After obtaining an array of regular features, the growth may be continued, either by OMVPE or by HVPE. It is carried out laterally, until coalescence of the islands. These surfaces resulting from the coalescence of islands exhibit superior crystal quality to the layers grown heteroepitaxially on sapphire.

The novelty of the process therefore consists in using the growth anisotropy to induce lateral growth, going as far as coalescence, and thus in obtaining a continuous strain-free GaN layer. The lateral growth takes place from gallium nitride features or islands having reduced defect densities, said features being obtained by localized epitaxy.

According to a variant, the epitaxial regrowth is carried out using undoped gallium nitride.

According to another variant, the epitaxial regrowth is carried out using gallium nitride doped with a dopant chosen from the group consisting of magnesium, zinc, cadmium, beryllium, calcium and carbon, especially with magnesium. This is because it has been found that the doping of gallium nitride with a doping agent, especially magnesium, modified the GaN growth mode and resulted in a relative increase in the growth rate in the $<10\bar{1}1>$ directions with respect to the growth rate in the [0001] direction. Preferably, the dopant/Ga molar ratio is greater than 0 and less than or equal to 1, advantageously less than 0.2.

According to another advantageous variant, the epitaxial regrowth is carried out in two steps.

Firstly, undoped gallium nitride is deposited on the etched dielectric or with a thickness of the order of one angstrom, under vertical growth anisotropy conditions, and then gallium nitride continues to be deposited in the presence of a dopant in order to favor the lateral growth resulting in coalescence of the features.

The invention also relates to the epitaxially grown gallium nitride layers, characterized in that they can be obtained by the above process. Advantageously, these layers have a defect density of less than those obtained in the prior art, especially less than approximately $10^9 cm^{-2}$.

Preferably, the epitaxial layer has a thickness of between 1 and 1000 micrometers and optionally in that it is self-supported after the substrate has been separated.

The invention finds particularly advantageous application in the production of diode lasers provided with an epitaxial gallium nitride layer described above.

Several embodiments of the process according to the invention will now be described in relation with FIGS. 1 and 8 and the examples.

FIG. 6 shows the advantageous effect of the magnesium dopant on the GaN growth mode in that it allows coalescence of the features to be obtained much more rapidly, resulting in the formation of a strain-free continuous gallium nitride layer in epitaxial relationship.

EXAMPLE 1

Figure 1:
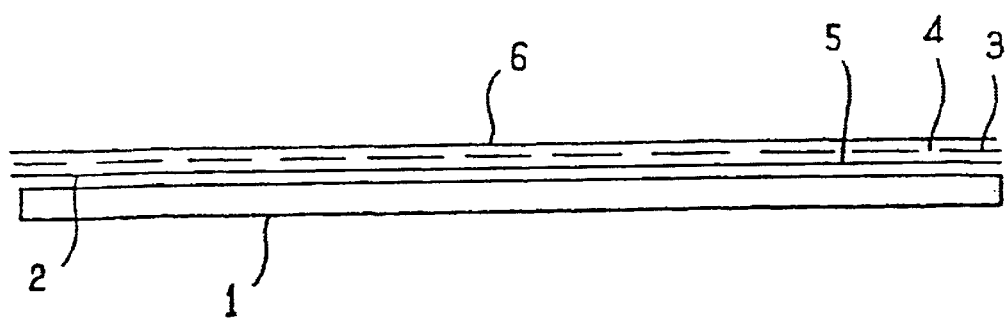
FIG. 1 is a schematic cross-sectional view of a gallium nitride layer according to the invention.

Deposition of an Undoped Gallium Nitride Layer

A suitable vertical reactor operating at atmospheric pressure is used for the OrGaNometallic Vapor Phase Epitaxy. A thin gallium nitride layer 2 having a thickness of 2 $\mu$m is deposited, by orGaNometallic vapor phase epitaxy at 1080° C. on a (0001) sapphire substrate 1 having a thickness of 200 $\mu$m. The gallium source is trimethylgallium (TMGa) and the nitrogen source is ammonia. Such a method is described in many documents.

The experimental conditions are as follows:

The gaseous vehicle is a mixture of $H_2$ and $N_2$ in equal proportions (4 sl/min.). The ammonia is introduced via a separate line (2 sl/min.).

After the first gallium nitride epilayer has been grown, a thin layer of a silicon nitride film 3 is deposited as a mask for the subsequent selective growth of gallium nitride using $SiH_4$ and $NH_3$ at a rate of 50 sccm$^-$ and 2 slm, respectively.

The electron transmission microscope observations on cross sections show that the mask obtained forms an amorphous continuous layer having a thickness of approximately 2 nm. Since the stoichiometry of this film was not measured, the term SiN will be used for the rest of this specification. Nevertheless, it seems that the stoichiometry corresponds to the $Si_3N_4$ term. Although extremely thin, this SiN layer proved to be a perfectly selective mask. The etching is then carried out, by photolithography and reactive ion etching, in order to expose hexagonal apertures 4 circumscribed by a 10 $\mu$m diameter circle. The distance between the centers of two adjacent apertures in the mask is 15 $\mu$m. The epitaxial regrowth on the exposed gallium nitride regions 5 in order to deposit gallium nitride is carried out on the specimens etched under conditions similar to those used for the standard gallium nitride growth, apart from the TMGa flow rate. This is fixed at a lower value (typically 16 $\mu$mol/min. for the experiments with undoped gallium nitride) so as to avoid high growth rates resulting from the very effective collection near the regions 5 of the gallium atoms encountering the surface of the mask. The localized epitaxy reveals a growth rate Vc of gallium nitride 6 in the [0001] direction virtually proportional to the space in between two apertures.

In addition, no nucleation on SiN is observed, even for large spacings. From this it may be concluded that the nucleation and the growth of GaN occurs selectively in the apertures 5. Consequently, the masked areas behave as concentrators, directing the atoms toward the apertures.

The growth rates are measured either in situ by laser reflectometry, or thereafter by scanning electron microscopy (SEM) on drop views or sections.

Figure 2:
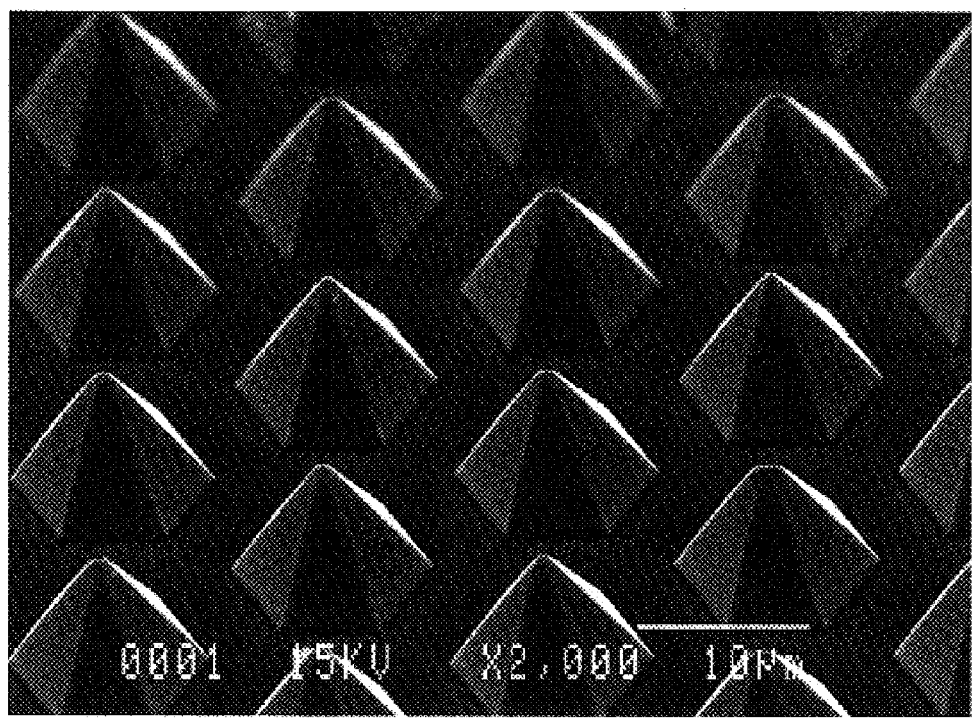
FIG. 2 is a photograph showing regular pyramidal features formed during the localized epitaxy using undoped gallium nitride, when the apertures in the dielectric are discrete apertures.

FIG. 2 is an SEM photograph showing the development of the pyramids.

Figure 3:
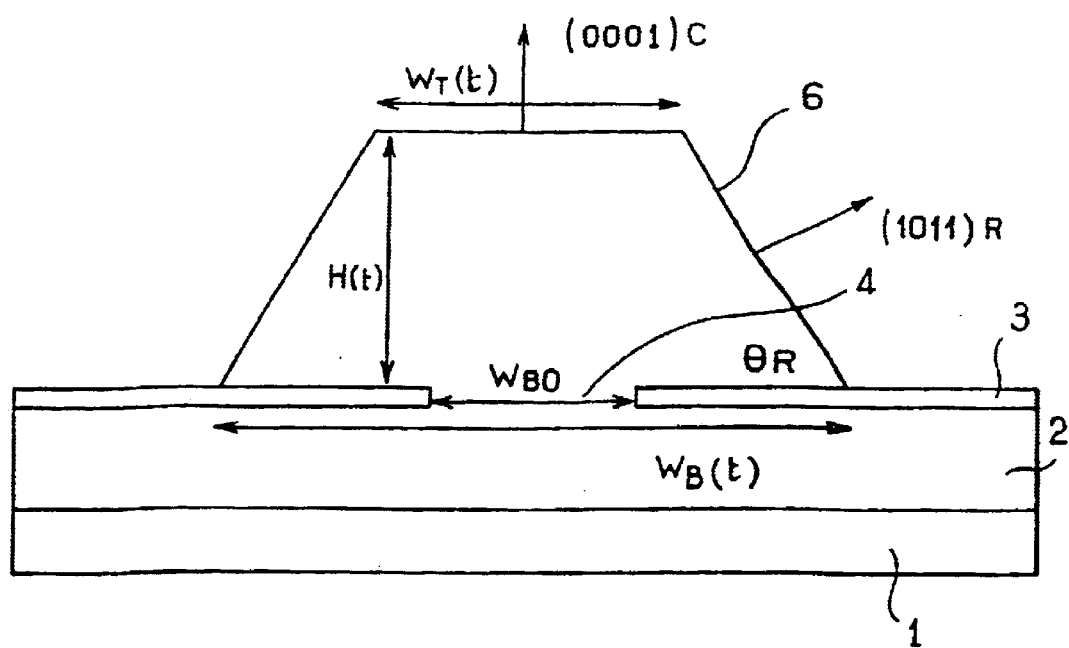
FIG. 3 is a sectional view perpendicular to the [11$\bar{2}$0] direction of a localized gallium nitride truncated hexagonal pyramid.

FIG. 3 is a sectional view perpendicular to the [11$\bar{2}$0] direction of a localized, truncated hexagonal gallium nitride pyramid. $W_T$, $W_B$ and H depend on the time t. $\theta_R$ is the angle between (0001) and (10$\bar{1}$1) defining the planes. $W_{BO}$ is the width of the apertures in the SiN mask.

Figure 4:
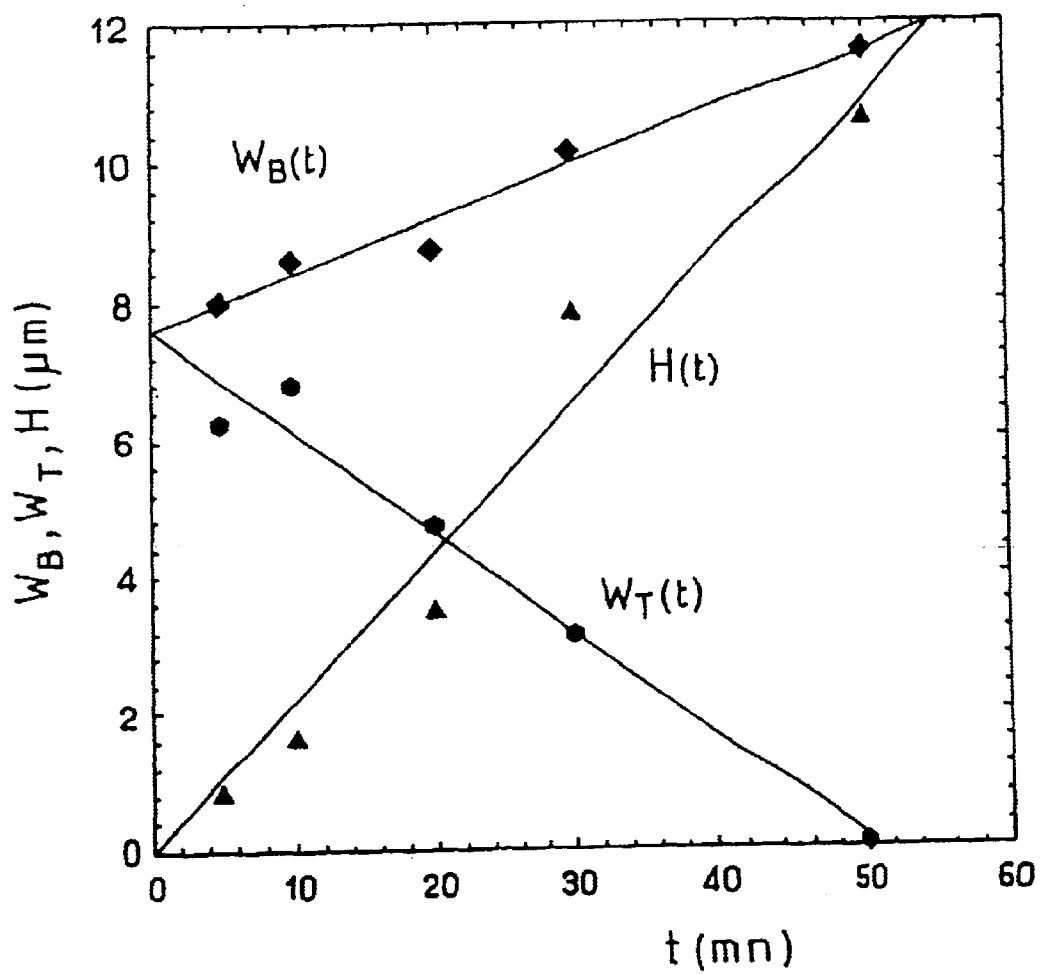
FIG. 4 shows the variation in $W_T$, $W_B$ and H values in $\mu$m as a function of the growth time in min. $W_T$, $W_B$ and H are defined in FIG. 3.

FIG. 4 shows the variation in the $W_T$, $W_B$ and H values in $\mu$m as a function of the growth time in min. Using linear regressions through the experimental points, the following results are obtained:

$V_R$=2.1 $\mu$m/h (lateral rate in the [10$\bar{1}$1] direction);

$V_c$=13 $\mu$m/h (rate in the [0001] direction);

$W_{BO}$=7.6 $\mu$m;

$\theta_R$=62.1°.

When $W_T$=0 at $t_0$ (the pyramid has a peak of zero width), the height H varies at a lower rate, given by the formula $V_R$/cos ($\theta_R$).

It will be noted that $V_C$ is extremely high compared with the rate of 1 $\mu$m/h measured for standard epitaxy on a (0001) substrate using the same vapor phase composition. Consequently, the $V_R/V_C$ ratio is only approximately 0.15.

EXAMPLE 2

Deposition in the Gaseous Phase of a Layer of Gallium Nitride to Which Magnesium Has Been Added The experiment of Example 1 is repeated apart from the fact that 2.8 $\mu$mol/min. of $(MeCp)_2Mg$ is introduced in the vapor phase. The conditions used are: growth time 30 min., growth temperature 1080° C., TMGa 16 $\mu$mol/min. and $N_2$, $H_2$ and $NH_3$ 2 sl/min. for each of them.

Figure 6:
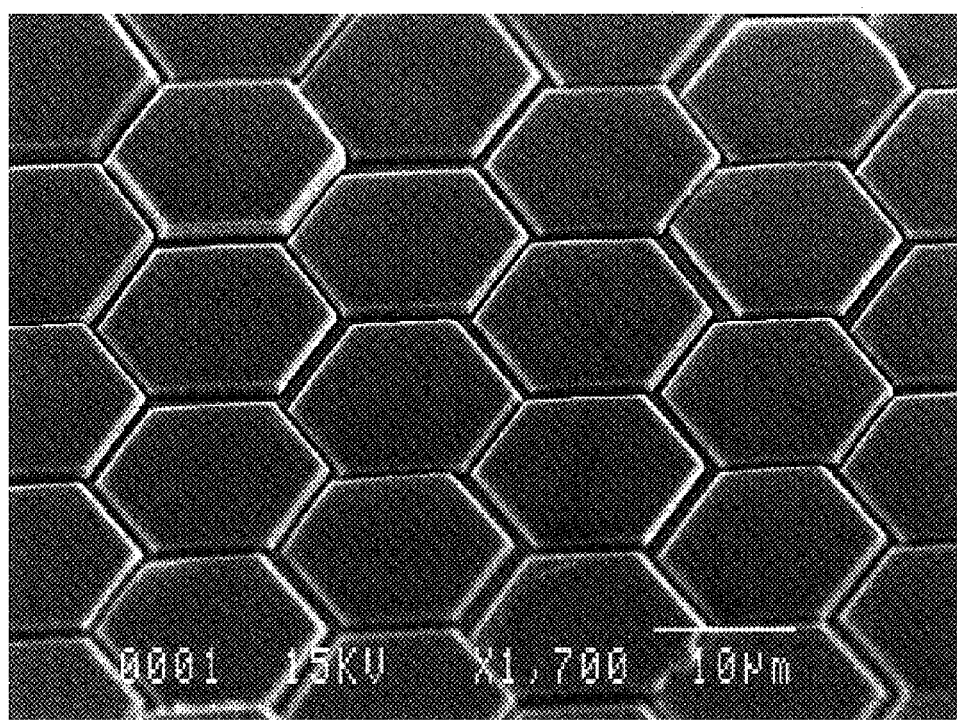
FIG. 6 is a photograph of the observed pyramids obtained by localized epitaxial regrowth with magnesium-doped GaN.

FIG. 6 shows that the presence of magnesium increases the $V_R/V_C$ ratio well above the cos ($\theta_R$) threshold and consequently the (0001) upper facet broadens. The selectivity of the growth is not affected by the presence of $(MeCp)_2Mg$, but the growth anisotropy is advantageously modified.

EXAMPLE 3

Influence of the Mg/Ga Molar Ratio

Figure 5:
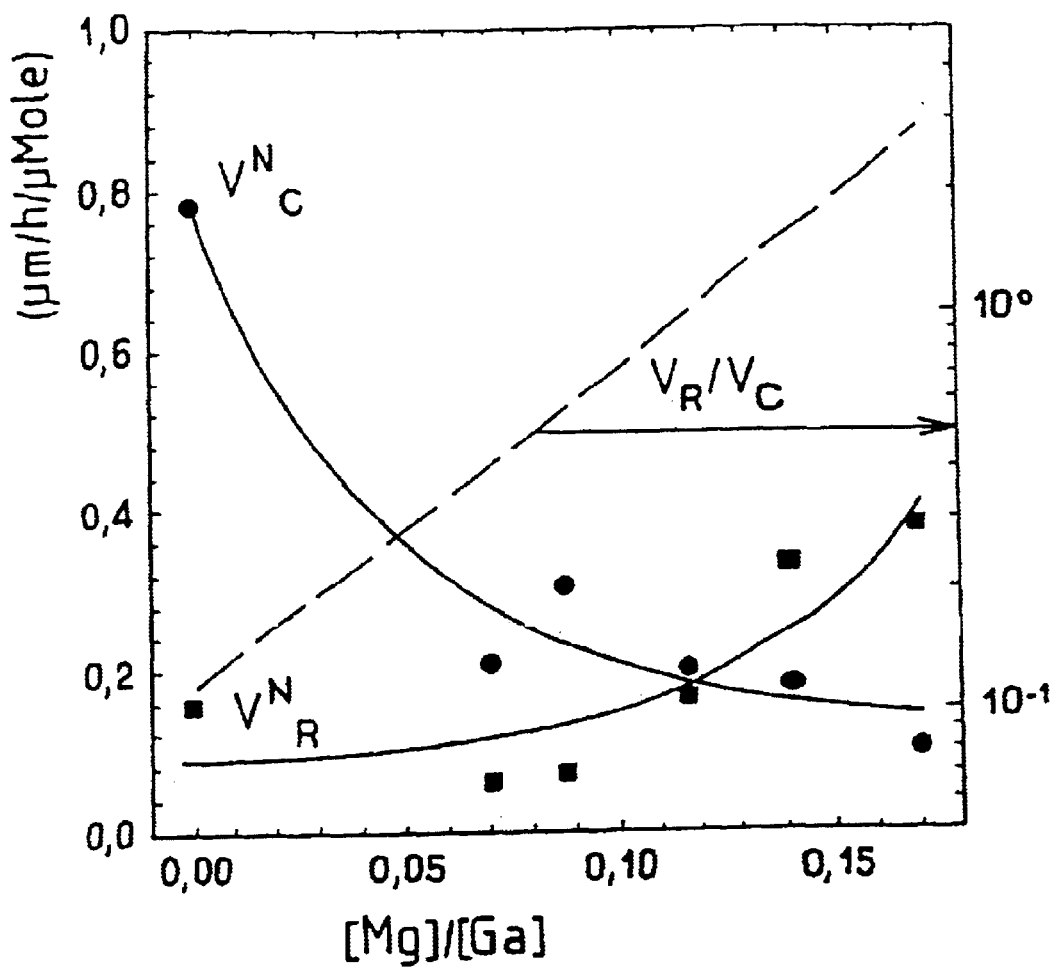
FIG. 5 shows the variation in the growth rates normalized to the molar flux of TMGA in the [0001] and <10$\bar{1}$1> directions as a function of the Mg/Ga molar ratio in the vapor phase.

FIG. 5 shows the variation in the growth rates normalized to the TMGA molar flux in the [0001] and [10$\bar{1}$1] directions as a function of the Mg/Ga molar ratio in the vapor phase.

In practice, it was chosen to keep a constant flux of (MeCp)$_2$Mg and to vary the amount of TMGA. This makes it possible to ensure that the available Mg concentration on the surface of the growth islands is identical for all the specimens.

Because the growth is controlled linearly by the amount of gallium supplied, the growth rates are normalized in order to compare them.

$V^N_C$ rapidly decreases from 0.8 to 0.1 µm/h/µmol, while $V^N_R$ increases from 0.16 to 0.4 µm/h/µmol when the Mg/Ga molar ratio varies from 0 to 0.17. The dotted line is the curve of the $V_R/V_C$ ratio obtained by extrapolation. The y-axis on the right is $V_R/V_C$.

This curve shows that the incorporation of Mg allows the pyramidal structure to be easily controlled by modifying the growth anisotropy. This suggests that Mg acts as a surfactant, favoring the adsorption of gallium on the {1011} faces but, conversely, preventing it on the (0001) faces.

EXAMPLE 4

Two-step Deposition of a Gallium Nitride Layer

Firstly, the process according to the invention is carried out using epitaxial regrowth under operating conditions comparable to those of Example 1.

An SiN mask is deposited on a GaN layer deposited beforehand in an epitaxial manner in a suitable reactor on a crystallization substrate such as sapphire. Linear apertures 5 µm in width and spaced apart by 5 µm are then made in the mask in order to expose the regions of the subjacent layer. The linear apertures are advantageously oriented in the GaN [10$\bar{1}$0] direction, although the variant of the process described in this example can be optionally carried out for other orientations of the linear apertures, especially in the GaN [11$\bar{2}$0] direction.

The epitaxial regrowth is carried out on the exposed regions with unintentionally doped GaN under operating conditions such that the growth rate in the [0001] direction of the GaN features sufficiently exceeds the growth rate in the direction normal to the inclined flanks of said features. Under such conditions, the anisotropy of the growth results in the disappearance of the (0001) facet. The first implementation step of the process is completed when the (0001) facet of the GaN feature has disappeared. At the end of the first step, the GaN features are in the form of a stripe, the cross section of which is triangular. However, it is possible to continue the first step until coalescence of the GaN features, in order to completely recover the mask. In this case, the cross section of the coalesced GaN features is a zigzag line.

The second step consists of the epitaxial regrowth with doped GaN, especially with magnesium-doped GaN according to Example 2 or 3, on the GaN features created in the first step. Due to the effect of introducing the dopant, the growth anisotropy is conducive to planarization of the GaN features. The facet C reappears at the top of each of the GaN features obtained in the first step. During this second step, the doped GaN features develop with an expansion of the facet C and, on the contrary, a reduction in the area of the flanks. The second step of the process according to the example is completed when the flanks have disappeared, the upper surface of the deposit formed by the coalesced doped-GaN features then being plane.

The implementation of the two-step process according to the invention as described above results, on the one hand, in the formation of a plane GaN layer, which can therefore serve as GaN substrate for the subsequent deposition, by epitaxial regrowth, of a device structure, especially a diode laser structure, but results, on the other hand, in a highly advantageous improvement in the crystal quality of said substrate. This is because the lines of crystal defects in the subjacent GaN layer propagate via the aperture made in the mask, vertically into the undoped GaN feature created in the first step. However, it seems that these lines of defects become curved during the second step devoted to the deposition of a doped-GaN features. This results in lines of defects which propagate in directions parallel to the surface of the masked GaN layer.

Because of the modification of the direction of propagation of the defects, the upper surface formed by the coalescence of the GaN features is virtually free of emerging defects in regions compatible with the size of electronic devices, such as GaN diode lasers.

EXAMPLE 5

Deposition of a Gallium Nitrite Layer Directly on a Substrate Masked by a Dielectric This example illustrates a method making it possible to obtain spontaneous formation of gallium nitride features or islands on a substrate by a treatment consisting in covering the substrate with a dielectric, especially silicon nitride, film whose thickness is of the order of 1 angstrom. Advantageously, this method makes it possible to avoid having to use ex situ etching of the mask by expensive techniques such as photolithography and chemical etching.

A suitable epitaxial growth reactor is used for the orGa-Nometallic vapor phase epitaxy. Explicitly, a substrate, especially (0001) sapphire chemically prepared beforehand by degreasing and pickling in an H$_2$SO$_4$:H$_3$PO$_4$ acid solution, in a 3:1 ratio, is heated to a temperature of approximately 1050–1080° C. in order to be nitrided by exposure to a stream of NH$_3$ for approximately 10 minutes. After this nitriding step, a very thin film of silicon nitride is formed on the surface of the substrate, the film being obtained by reaction between NH$_3$ and silane SiH$_4$ at a temperature of 1080° C. for a time short enough to limit the thickness of the film to that of one atomic plane.

The operating conditions are the following:

The gaseous vehicle is a mixture of nitrogen and hydrogen in equal proportions (4 sl/Min.). The ammonia is introduced with a flow rate of 2 sl/min. while the silane, in a form diluted to 50 ppm in hydrogen, is introduced with a flow rate of 50 scc/min. Under these conditions, the typical NH$_3$ and SiH$_4$ reaction time is of the order of 30 seconds.

The successive steps are monitored by laser reflectometry (LR) and transmission electron microscopy (TEM).

After the dielectric layer has been completely formed, a continuous gallium nitrite layer having a thickness of 20 to 30 nm is deposited on the dielectric film. The deposition of the GaN layer is made at a low temperature, of the order of 600° C.

After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin dielectric film beneath the GaN layer, the morphology of said GaN layer undergoes deep modification resulting from solid-phase recrystallization by mass transport. When the temperature approaches 1060° C., it should be noted that the reflectivity of the buffer layer suddenly decreases. The initially continuous buffer layer is then converted into a discontinuous layer formed from gallium nitride islands.

Figure 7:
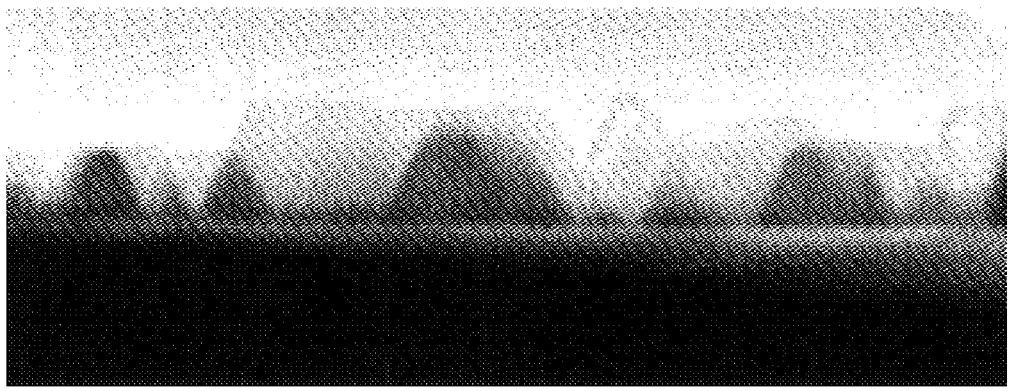
FIG. 7 is a photograph of the pyramids obtained during growth according to the Example 5, in transmission electron microscopy.

At the end of this spontaneous in situ recrystallization process, GaN features or islands of very good crystal quality are obtained, these retaining an epitaxial relationship with the substrate by virtue of the very small thickness of the dielectric layer. The GaN features or islands are isolated from one another by regions or the dielectric layer is bared. The characteristic heights of the islands are of the order of 2400 angstroms. The observation obtained with a transmission electron microscope shows that the islands tend to take the shape of truncated pyramids (FIG. 7).

Figure 8:
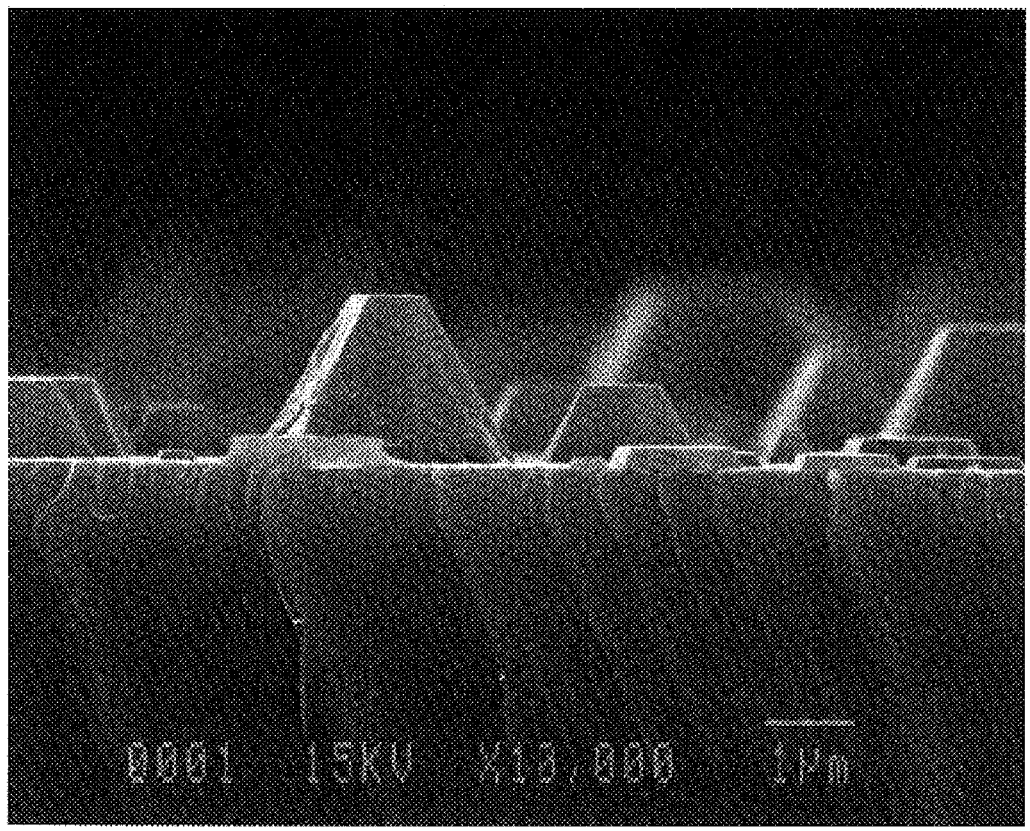
FIG. 8 is a photograph of the pyramids obtained during growth according to Example 5, in scanning electron microscopy.

FIG. 8 is a scanning electron microscope image of a specimen obtained under operating conditions that are modified so as to increase the dimensions of the islands to micrometric values comparable to those of the islands or features obtained in the apertures of a mask (cf. Example 1) produced ex situ by photolithography.

During the subsequent epitaxial regrowth with gallium nitride on the surface of a specimen, those regions of the dielectric where the layer of the dielectric is bared will function as the mask of FIG. 1 and the GaN features or islands thus spontaneously formed are the analogues of the GaN features (cf. FIG. 1 or FIG. 2) located in the apertures (cf. FIG. 1) which are produced ex situ in the mask (cf. FIG. 1). Explicitly, the GaN features or islands will develop by lateral and vertical growth.

GaN layers have thus been obtained by coalescence of the GaN features having a defect density of the order of $10^8$ cm$^{-2}$, i.e. two orders of magnitude less than that of the defects present in the gallium nitride layers produced using the conventional methods.

Thus, in the variants of the process that have been described in the above examples, especially Example 4 describing a two-step variant, the use of the ex situ process of etching the apertures in a mask may advantageously be avoided and replaced with the in situ spontaneous formation, described above, of the GaN islands or features, the control of their geometry and dispersion not being a prerequisite for improving the quality of the GaN layers formed by this process.

What is claimed is:

1. A process for producing an epitaxial layer of gallium nitride (GaN) comprising:

forming on a surface of a substrate, a film of a dielectric whose thickness is of the order of about one monolayer;

depositing a continuous gallium nitride layer on the dielectric film at a temperature sufficiently low to suppress island formation of the gallium nitride;

after depositing the gallium nitride layer, annealing the gallium nitride layer at a temperature sufficiently high to promote island formation of the gallium nitride, performing an epitaxial regrowth with gallium nitride at the end of a spontaneous in situ formation of islands of gallium nitride.

2. A process for producing an epitaxial layer of gallium nitride according to claim 1, wherein the substrate is selected from the group consisting of sapphire, ZnO, 6H-SiC and LiAlO$_2$.

3. A process for producing an epitaxial layer of gallium nitride (GaN) according to claim 1 wherein the dielectric layer is a layer of the Si$_x$N$_y$ type.

4. A process for producing an epitaxial layer of gallium nitride according to claim 1 wherein the low temperature for depositing a continuous gallium nitride layer is of the order of about 600° C.

5. A process for producing an epitaxial layer of gallium nitride according to claim 1 wherein the high temperature for annealing the gallium nitride layer is of the order of about 1080° C.

6. A process for producing an epitaxial layer of gallium nitride (GaN) according to claim 1 wherein the low temperature for depositing a continuous gallium nitride layer is of the order of about 600° C. and the high temperature for annealing the GaN layer is of the order of about 1080° C.

7. A process for producing an epitaxial layer of gallium nitride according to claim 1 wherein forming the dielectric comprises reacting ammonia and silane.

8. A process for producing an epitaxial layer of gallium nitride according to claim 1 wherein the temperature for depositing a continuous gallium nitride layer is of the order of about 600° C. and the temperature for annealing the gallium nitride layer is of the order of about 1080° C. and wherein the dielectric layer is a layer of the Si$_x$N$_y$ type.

9. A process for producing an epitaxial layer of gallium nitride according to claim 8, wherein forming the dielectric layer comprises reacting ammonia and silane.

10. A process for producing an epitaxial layer of gallium nitride according to claim 1 wherein depositing the continuous gallium nitride layer comprises depositing the layer to a thickness on the order of about 20 to 30 nm.

11. A process for producing an epitaxial layer of gallium nitride according to claim 6 wherein depositing the continuous gallium nitride layer comprises depositing the layer to a thickness on the order of about 20 to 30 nm.

12. A process for producing an epitaxial layer of gallium nitride according to claim 1 further comprising prior to forming the dielectric layer, nitriding the surface of the substrate.

13. An epitaxial gallium nitride layer, obtained by the process according to claim 1.

14. An epitaxial gallium nitride layer, obtained by the process according to claim 8.

15. An optoelectronic component, provided with an epitaxial layer of gallium nitride according to claim 14.

16. An optoelectronic component, provided with an epitaxial layer of gallium nitride according to claim 14.

17. An optoelectronic component of claim 16, comprising a diode laser.

18. A gallium nitride layer obtained by epitaxial lateral overgrowth on a crystalline substrate comprising an epitaxial gallium nitride layer according to claim 13.

19. A gallium nitride layer obtained by epitaxial lateral overgrowth on a crystalline substrate comprising an epitaxial gallium nitride layer according to claim 14.

* * * * *

UNITED STATES PATENT AND TRADEMARK OFFICE
CERTIFICATE OF CORRECTION

PATENT NO. : 6,802,902 B2
DATED : October 12, 2004
INVENTOR(S) : Beaumont et al.

It is certified that error appears in the above-identified patent and that said Letters Patent is hereby corrected as shown below:

Title page,
Item [56], References Cited, U.S. PATENT DOCUMENTS, please delete "2002/0069817" and insert -- 2002/069817 --.
Item [57], ABSTRACT,
Lines 11-12, please delete "chemical ethching techniques" and insert -- chemical etching techniques --.

Column 10,
Line 16, please delete "600° C." and insert -- 600° C --.
Line 21, please delete "600° C. and the temperature for annealing the gallium nitride layer is of the order of about 1080° C." and insert -- 600° C and the temperature for annealing the gallium nitride layer is of the order of about 1080° C --

Signed and Sealed this

Twenty-second Day of March, 2005

JON W. DUDAS
*Director of the United States Patent and Trademark Office*